United States Patent [19]

Wright

[11] Patent Number: 4,670,681

[45] Date of Patent: Jun. 2, 1987

[54] SINGLY ROTATED ORIENTATION OF QUARTZ CRYSTALS FOR NOVEL SURFACE ACOUSTIC WAVE DEVICES

[75] Inventor: Peter V. Wright, Dallas, Tex.

[73] Assignee: R. F. Monolithics, Inc., Dallas, Tex.

[21] Appl. No.: 891,236

[22] Filed: Jul. 29, 1986

[51] Int. Cl.⁴ .................................... H01L 41/08
[52] U.S. Cl. ............................. 310/313 A; 310/313 B
[58] Field of Search .......... 310/313 R, 313 A, 313 B, 310/313 C, 361; 333/150-155, 193-196

[56] References Cited

U.S. PATENT DOCUMENTS

| | | | |
|---|---|---|---|
| 3,956,646 | 5/1976 | Shibayama et al. | 310/313 A |
| 3,987,377 | 10/1986 | Kuroda | 310/313 A X |
| 4,220,888 | 9/1980 | Gagnepain et al. | 310/313 A |
| 4,232,240 | 11/1980 | O'Connell | 310/313 A |
| 4,472,656 | 9/1984 | Franx | 310/361 |
| 4,484,098 | 11/1984 | Cullen et al. | 310/313 A |
| 4,489,250 | 12/1984 | Ebata et al. | 310/313 A |
| 4,499,395 | 2/1985 | Kahan | 310/361 |
| 4,511,817 | 4/1985 | Chai et al. | 310/313 A |

*Primary Examiner*—Mark O. Budd
*Attorney, Agent, or Firm*—Sigalos & Levine

[57] ABSTRACT

An ST cut quartz crystal for surface acoustic wave device application defined by the Euler angles lambda (λ) equal about 0°, mu (μ) equal about 132.75° and with an acoustic wave propagation direction theta (θ) equal about plus or minus 25°.

8 Claims, 4 Drawing Figures

SINGLY ROTATED ORIENTATION OF QUARTZ CRYSTALS FOR NOVEL SURFACE ACOUSTIC WAVE DEVICES

BACKGROUND OF THE INVENTION

This invention relates to an optimal acoustic wave propagation orientation on an ST Cut Quartz Crystal for surface acoustic wave (SAW) device application.

In this application an "ST Cut Quartz Crystal" is defined as a quartz crystal having standard Euler angles lambda ($\lambda$) and mu ($\mu$) and does not include the wave propagation angle theta ($\theta$), on the cut.

A wide variety of SAW devices are now produced for use in the VHF and UHF range and include filters, resonators, delay lines, convolvers, impedance elements and various types of sensors.

SAW devices typically involve interdigitated electrodes formed on some type of piezo-electric substrate such as quartz, lithium niobate and the like.

The orientations for surface acoustic wave propagation for any given crystal substrate are completely defined by the Euler angles, lambda, mu and theta. The first two angles, lambda and mu, define the crystal cut and the third angle, theta, defines the direction of acoustic wave propagation in that cut. Thus, acoustic wave propagation orientation on the crystal is defined by a unique set of all three Euler angles. (See Goldstein, H., *Classical Mechanics*, New York, (1950) (Addison-Wesley).

For a variety of surface wave materials and particular crystal cuts of interest, various surface acoustic wave propagation properties can be tabulated. Such tabulation includes velocity, coupling coefficient, electromechanical power flow angle curves, and magnitude and phase of the free surface mechanical displacements and electric surface potential. (See *Microwave Acoustic Handbook IA and 2*, Slobodnik et al, Air Force Cambridge Research Labs, October 1973 and October 1974.) Such data as set forth in these handbooks can be used a guide to selecting appropriate directions for wave propagation and orientation in the crystal necessary to achieve the desired transduction characteristic. Further, principal properties of interest include the effective centers of transduction, centers of reflection, temperature coefficient of delay, spurious bulk responses, diffraction characteristics, effective dielectric constants and the like.

The present invention relates to a newly discovered Quartz Crystal cut having a substantially planar surface defined by the Euler angles lambda ($\lambda$) equal about 0°, mu ($\mu$) equal about 132.75° and theta ($\theta$) equal about plus or minus 25°. This crystal has the advantage of having Euler angles lambda ($\lambda$) and mu ($\mu$) identical to those of the standard ST cut crystal. Thus the normal ST cut wafer can be used with a newly discovered wave propagation angle approximately plus or minus 25° from the x-axis. It has excellent coupling between the voltage on the electrodes and the acoustic waves in the crystal itself, has low beam steering and good temperature stability. It can be used for forming a SAW device used as an impedance element, a coupled resonator, or a filter.

Further, this cut and novel wave propagation direction allows the construction of a two electrode per wavelength transducer with unidirectional characteristics. It also allows the construction of a two electrode per wavelength transducer with a desired symmetrical input conductance function and a flat susceptance region. See U.S. Pat. No. 4,599,587 issued July 8, 1986 and entitled *Impedance Element* for a further description of another embodiment of such a transducer.

SUMMARY OF THE INVENTION

Thus it is an object of the present invention to provide a quartz crystal cut having a substantially planar surface defined by the Euler angles lambda equal about 0°, and mu equal about 132.75° and having a wave propagation direction theta equal about plus or minus 25°.

The invention also relates to a method of forming a quartz crystal cut comprising the steps of forming a substantially planar crystal surface, and defining the Euler angle cuts of the planar surface by the Euler angles lambda equal about 0°, and mu equal about 132.75° and the wave propagation direction Euler angle theta equal about plus or minus 25°.

DESCRIPTION OF THE PREFERRED EMBODIMENT

These and other objects of the present invention will be described more completely in conjunction with the accompanying drawings in which.

Figure 3:
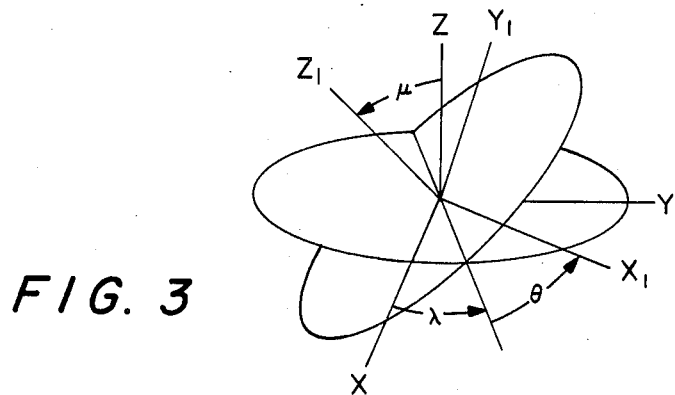
Figure 4:
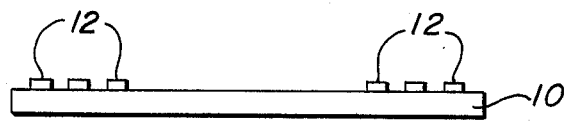

FIG. 3 is a representation of the Euler angle theta ($\theta$) or the direction of acoustic propagation in the cut crystal in a direction theta ($\theta$) equal about plus or minus 25°; and FIG. 4 illustrates the side view of a surface acoustic wave device having interdigitated electrodes on the planar surface and having the quartz crystal cut with the Euler angles lambda equal about 0° and mu equal about 132.75° and the direction of propagation angle theta equal about plus or minus 25°.

DETAILED DESCRIPTION OF THE DRAWINGS

The newly discovered wave propagation direction on an ST cut quartz crystal provides improved performance of surface acoustic wave (SAW) devices. ST cut quartz crystal substrates are well known in the art and are usually cut in the form of wafers which are thin slices having two substantially planar surfaces with at least one of the planar surfaces cut with the particular orientation that gives the temperature compensated cut. The surface of the crystal on which the electrodes are to be placed is made flat and smooth before the electrodes are placed upon it.

Saw devices are used for a large number of applications including impedance elements, resonators, coupled resonators, filters and the like. It is important that the crystal be cut such that good coupling exists between the voltage on the electrodes and the acoustic waves in the crystal itself. The crystal should have low beam steering and good temperature stability.

The orientations for surface acoustic wave propagation for any given crystal are completely defined by the Euler angles, lambda ($\lambda$), mu ($\mu$), and theta ($\theta$). The first two angles, lambda and mu, define the crystal cut and the third angle theta, defines the direction of acoustic wave propagation on that cut. Thus, acoustic wave propagation orientation in the crystal is defined by a unique set of all three Euler angles. Various surface acoustic propagation properties exist at various orientations for a variety of surface wave materials in particular crystal cuts of interest. These properties include velocity, coupling coefficient, electromechanical power flow angle curves, and magnitude and phase of the free surface mechanical displacements and electric surface potential. In addition, other properties include the temperature coefficient of delay, spurious bulk responses, diffraction characteristics, dielectric constants and the like.

The present ST quartz crystal cut with its novel and unique propagation direction allows the construction of a two electrode per wavelength transducer with unidirectional characteristics. It also allows the construction of a two electrode per wavelength transducer with a desired symmetrical input conductance function and a flat susceptance region.

Figure 1:
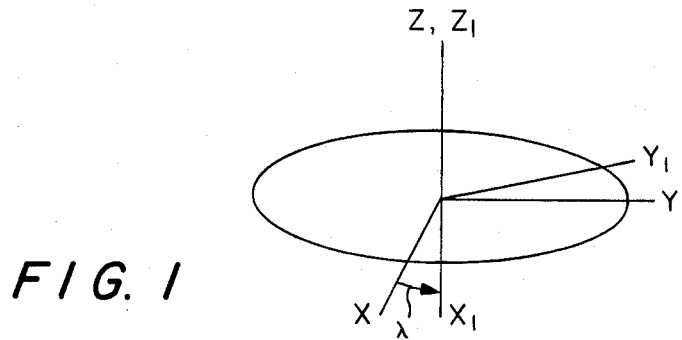
FIG. 1 is a representation of the Euler angle lambda ($\lambda$) and the direction in which it is moved a distance equal about 0° in forming the crystal of the present invention.

FIG. 1 illustrates the plane of the Euler angle lambda ($\lambda$) and the direction of its rotation a distance equal about 0°.

Figure 2:
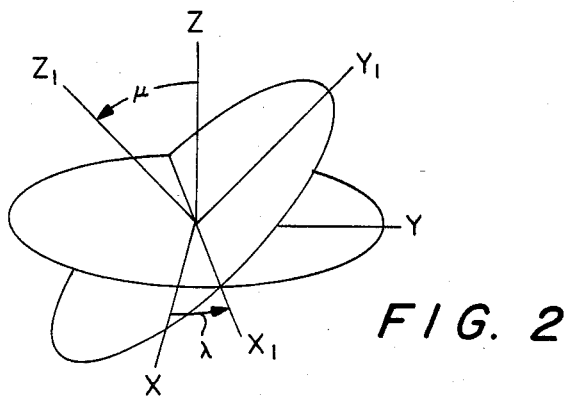
FIG. 2 is a representation of the Euler angle lambda ($\lambda$) in its moved position and the Euler angle mu ($\mu$) and the direction it is moved equal about 132.75°.

FIG. 2 illustrates the ST cut quartz crystal having a surface which is defined by the Euler angles lambda ($\lambda$) equal about 0° and mu ($\mu$) rotated an angle equal about 132.75°.

The angles lambda and mu are typical for an ST cut quartz crystal but the propagation direction theta ($\theta$) is unique and is varied approximately plus or minus 25° from the typical acoustic wave propagation direction as shown in FIG. 3 to give new and unusual results specifically including the construction of a two electrode per wavelength transducer having unidirectional wave propagation characteristics. The transducer has a symmetrical conductance function and a flat susceptance region. This structure can be obtained because the separation of the centers of transduction and reflection on this newly discovered orientation is approximately 45°, the desired separation as set forth in U.S. Pat. No. 4,599,587 issued July 8, 1986 and entitled *Impedance Element*. The new orientation also possess a good coupling coefficient, acceptable beam steering and good temperature stability. Thus this structure is formed on a standard ST cut crystal, with an unusual orientation of the wave propagation direction on the cut to enable unidirectional wave propagation.

FIG. 4 disclosed the ST cut quartz crystal 10 with the novel acoustic wave propagation orientation on the cut of plus or minus about 25° and illustrates two electrodes 12 per wavelength placed thereon which allows various acoustic wave devices to be formed.

Thus a new quartz crystal orientation has been disclosed which utilizes a standard ST cut plate with an unusual propagation direction on the cut and the substantially planar surfaces defined by particular Euler angles including lambda equal about 0°, mu equal about 132.75° and theta equal about plus or minus 25°. The novel orientation allows a unidirectional transducer to be constructed with two electrodes per wavelength and which has a good coupling coefficient between the voltage placed on the electrodes and the acoustic waves in the crystal itself, has low beam steering and good temperature stability.

While the invention has been described in connection with a preferred embodiment, it is not intended to limit the scope of the invention to the particular form set forth but, on the contrary, it is intended to cover such alternatives modifications, and equivalents as may be included within the spirit and scope of the invention as defined by the appended claims.

I claim:

1. An ST quartz crystal cut having a substantially planar surface defined by the Euler angles $\lambda$=about 0°, $\mu$=about 132.75° and $\theta$=about plus or minus 25°.

2. A unidirectional surface acoustic wave device comprising two interdigitated electrodes per wavelength on the planar surface of the ST cut quartz crystal of claim 1 to obtain unidirectional transmission.

3. The device of claim 2 in which the crystal is in the form of a wafer.

4. An ST crystal cut for acoustic wave propagation comprising a thin quartz plate having a singly rotated crystallographic orientation around the X-axis of said plate by an angle $\mu$ of about 132.75° having a wave propagation direction of $\theta$=about ±25°.

5. A method of forming a quartz crystal comprising steps of:
   a. forming an ST cut quartz crystal having a substantially planar surface, and
   b. defining the planar surface by the Euler angles $\lambda$=about 0°, $\mu$=about 132.75° and $\theta$=about ±25°.

6. A method of forming a unidirectional surface acoustic wave device comprising the steps of:
   a. forming an ST cut quartz crystal having a substantially planar surface,
   b. defining the planar surface by the Euler angles $\lambda$=about 0° and $\mu$=about 132.75° and
   c. placing two interdigitated electrodes per wavelength on said planar surface to propagate acoustic waves at an Euler angle $\theta$=about ±25° to obtain unidirectional transmission.

7. The method of claim 6 further comprising the step of constructing said crystal in the form of a wafer.

8. The method of forming an ST crystal cut for acoustic wave propagation comprising the steps of:
   a. forming said crystal of a thin quartz plate, and
   b. singly rotating the crystallographic orientation of said plate around the x-axis of said plate by an angle $\mu$=about 132.75° and having a wave propagation direction angle $\theta$=about ±25°.

* * * * *